United States Patent [19]

Cory

[11] Patent Number: 5,214,381

[45] Date of Patent: May 25, 1993

[54] METHOD FOR SELECTIVELY EXCITING NUCLEAR SPINS IN A RADIO-FREQUENCY FIELD WITH PREDETERMINED STRENGTH

[75] Inventor: David G. Cory, Boston, Mass.

[73] Assignee: Bruker Instruments, Inc., Billerica, Mass.

[21] Appl. No.: 860,685

[22] Filed: Mar. 30, 1992

[51] Int. Cl.$^5$ ............................................. G01V 3/00
[52] U.S. Cl. ..................................... 324/307; 324/309
[58] Field of Search ............... 324/300, 307, 308, 309, 324/313, 314

[56] References Cited

U.S. PATENT DOCUMENTS

| | | | |
|---|---|---|---|
| 4,999,580 | 3/1991 | Meyer et al. | 324/309 |
| 5,117,186 | 5/1992 | Burum et al. | 324/307 |

OTHER PUBLICATIONS

"Time-Suspension Multiple-Pulse Sequences: Applications to Solid-State Imaging", D. G. Cory, J. B. Miller and A. N. Garroway Journal of Magnetic Resonance, vol. 90, pp. 205-213 (1990).
"Selective Excitation in Fourier Transform Nuclear Magnetic Resonance", G. A. Morris and R. Freeman, Journal of Magnetic Resonance, vol. 29, p. 433 (1978).
"A Simple Pulse Sequence for Selective Excitation in Fourier Transform NMR", G. Bodenhausen, R. Freeman and G. A. Morris, Journal of Magnetic Resonance, vol. 23, p. 171 (1976).
"Multiple-Pulse Methods of 1H N.M.R. Imaging of Solids: Second Averaging", Physics, vol. 70, No. 2, pp. 331-345 (1990).

*Primary Examiner*—Louis Arana
*Attorney, Agent, or Firm*—Wolf, Greenfield & Sacks

[57] ABSTRACT

In an NMR spectrometer, nuclear spins are subjected to a radio-frequency (RF) pulse sequence consisting of repeating cycles, each having a first and a second pulse set. The first pulse set generates a first large-amplitude rotation of the spins in which the angle through which the spins rotate varies with RF field strength. The second pulse set generates a second rotation which has an axis orthogonal to the first rotation axis and the angle through which the spins rotate is independent of the RF field strength. When the nuclear spins are placed in a non-homogeneous RF field and the above pulse sequence is applied, those spins which are located in an area where the RF field strength causes the first pulse set to rotate the spins through an angle which is a multiple of $2\pi$, the second, uniform rotation accumulates with each repetition of the first and second pulse sets in order to selectively excite those spins.

14 Claims, 5 Drawing Sheets

METHOD FOR SELECTIVELY EXCITING NUCLEAR SPINS IN A RADIO-FREQUENCY FIELD WITH PREDETERMINED STRENGTH

FIELD OF THE INVENTION

This invention relates to NMR spectroscopy and NMR imaging and, in particular to radio-frequency (RF) pulse sequences for selectively exciting those NMR-active nuclei that are positioned in a near resonant radio-frequency field of a predetermined strength.

BACKGROUND OF THE INVENTION

Many atomic nuclei possess a magnetic moment. Nuclear magnetic resonance (NMR) is a phenomenon exhibited by this select group of atomic nuclei (termed "NMR active" nuclei), which results from the interaction of the nuclei with an applied, external magnetic field.

The magnetic properties of a nucleus are conveniently discussed in terms of two quantities: the magnetogyric ratio (denoted by the symbol $\gamma$); and the nuclear spin (denoted by the symbol I). When an NMR active nucleus is placed in a magnetic field, its nuclear magnetic energy levels are split into $(2I+1)$ non-degenerate energy levels, and these levels are separated from each other by a characteristic energy that is directly proportional to the strength of the applied magnetic field. This phenomenon is called "Zeeman" splitting and the characteristic energy is equal to $\gamma h\, H_o/2\pi$, where h is Plank's constant and $H_o$ is the strength of the magnetic field. The frequency corresponding to the energy of the Zeeman splitting ($\omega_o = \gamma H_o$) is called the "Larmor frequency" or "resonance" frequency. Typical NMR active nuclei include $^1H$ (protons), $^{13}C$, $^{19}F$, and $^{31}P$ nuclei For these four nuclei, the nuclear spin $I=\frac{1}{2}$, and, accordingly, each nucleus has two nuclear magnetic energy levels.

When a bulk material sample containing NMR active nuclei is placed within a magnetic field, the nuclear spins distribute themselves amongst the nuclear magnetic energy levels in a known manner in accordance with Boltzmann's statics. This distribution results in a population imbalance between the energy levels and a net nuclear magnetization. It is this net nuclear magnetization that is studied by NMR techniques.

At equilibrium, the net nuclear magnetization is aligned with the external magnetic field and is time-independent. A second magnetic field perpendicular to the first magnetic field and rotating at, or near, the Larmor frequency can also be applied to the nuclei and this second field disturbs the equilibrium and induces a coherent motion (a "nutation") of the net nuclear magnetization. Since, at conventional magnetic field strengths, the Larmor frequency of typical NMR active nuclei is in the megahertz range, this second field is called a "radio frequency field" (RF field). The effect of the RF field is to rotate the spin magnetization about the direction of the applied RF field. The time duration of the applied RF field determines the angle through which the spin magnetization nutates and, by convention, an RF pulse of sufficient length to nutate the nuclear magnetization through an angle of 90°, or $\pi/2$ radians, is called a "$\pi/2$ pulse".

A $\pi/2$ pulse applied at a frequency near the resonance frequency will rotate a spin magnetization that was aligned along the external magnetic field direction in equilibrium into a plane perpendicular to the external magnetic field. The component of the net magnetization that is transverse to the external magnetic field then precesses about the external magnetic field at the Larmor frequency. This precession can be detected with a resonant coil located with respect to the sample such that the precessing magnetization induces a voltage across the coil. Frequently, the "transmitter" coil employed to apply the RF field to the sample and cause the spin magnetization to nutate and the "receiver" coil employed to detect the resulting precessing magnetization are one and the same coil. This coil is generally part of an NMR probe.

In addition to precessing at the Larmor frequency, the magnetization induced by the applied RF field changes and reverts to the equilibrium condition over time as determined by two relaxation processes: (1) dephasing within the transverse plane ("spin-spin relaxation") with an associated relaxation time, $T_2$, and (2) a return to the equilibrium population of the nuclear magnetic energy levels ("spin lattice relaxation") with an associated relaxation time, $T_1$.

When an external magnetic field is applied to a nuclei in a chemical sample, the nuclear magnetic moments of the nuclei each experience a magnetic field that is reduced from the applied field due to a screening effect from the surrounding electron cloud. This screening results in a slight shift of the Larmor frequency for each nucleus (called the "chemical shift" since the size and symmetry of the shielding is dependent on the chemical composition of the sample).

In addition to the applied external magnetic field, each nucleus is also subject to local magnetic fields such as those generated by other nuclear and electron magnetic moments associated with nuclei and electrons located nearby. Interaction between these magnetic moments are called "couplings", and one important example of such couplings is the "dipolar" coupling. In solids, the NMR spectra of spin=$\frac{1}{2}$ nuclei are often dominated by dipolar couplings, and in particular by dipolar couplings with adjacent protons.

Normally, it is desirable to construct an NMR probe so that the RF field is homogeneous over the entire sample volume, so that an RF pulse generated by the probe uniformly excites all spins of a given nuclear type. However, in some cases, it is useful to intentionally build an NMR probe such that the RF field strength generated by the probe varies across the sample volume. For example, in certain NMR spatial imaging studies, the volume of the material under study may be too large to be entirely enclosed in a single RF coil; alternatively only a small portion of the sample may be of interest. Consequently, in these studies, RF coils are placed on the surface of the material and used to remotely generate RF fields within the body of the material. The variation of the RF field strength produced by the coils can then be used to selectively excite only those nuclei that are of interest. Additionally, in such situations the effective "filling factor" of the receiver coil is increased resulting in an improved signal to-noise ratio. In these situations it is important that the nuclear spins be excited only at the remote site in order to avoid interference signals generated by the spins in intervening locations.

In other studies, it is desirable to use techniques which excite nuclei in a selected plane or slice. For example, prior to recording a two dimensional NMR image, it is normal to selectively excite those nuclei that are located within a thin plane of the sample so that the final NMR image reveals the variations in nuclear spin density within this plane. One approach to generating a variable RF field strength in connection with these latter imaging studies is to use an RF field strength selective pulse sequence. Such an RF field strength selective pulse sequence would also be useful for spatially selective surface coil measurements in solids previously mentioned.

There are also applications in NMR spectroscopy which benefit from RF field strength selective excitation. For instance, although it is desirable to apply the RF excitation pulse so that the RF field is substantially constant over the entire sample, the RF field in a conventional coil is not constant and uniform due to end effects of the coil and due to the discrete wire placement of the coil construction. In experiments which use multiple pulse sequences that function best at a precise, predefined RF field strength, it is desirable to use RF field strength selective excitation in order to selectively excite only those nuclei that are in the correct RF field strength. Background resonances from materials that are near, but outside of the RF coil can also be a problem, and since the background signal originates from areas where the RF field strength is weaker than it is within the coil, it is again desirable to use RF field strength selective excitation in order to selectively excite only those nuclei that are in correct RF field strength.

Traditionally, RF field strength selective sequences have been composed of phase cycled $\pi$ pulses, $n\pi$ pulses or composite pulse versions of these latter pulse types. Unfortunately, a single $\pi$ pulse is not very selective and, therefore, large strings of $\pi$ pulses must frequently be employed to obtain a reasonable selectivity. A string of $n\theta$ pulses creates an RF profile with the functional form of $(\cos\theta)^n$. In order to improve the selectivity, other known techniques have been employed including the use of retrograde composite $\pi$ pulse sequences. Dipolar decoupled composite inversion pulses have also been used in surface coil studies of abundant nuclei in solid samples.

Accordingly, it is an object of the present invention to provide an RF field strength selective excitation method.

It is another object of the present invention to provide an RF field strength selective excitation method that is applicable to both liquid and solid samples.

It is still another object of the present invention to provide an RF field strength selective excitation method that is capable of selectively exciting those nuclear spins that are located in a very narrow range of RF field strengths.

It is yet another object of the present invention to provide an RF field strength selective excitation method that allows for simple variability in the width and mean of the selected field strengths.

It is a further object of the present invention to provide an RF field strength selective excitation method that is compatible with conventional selective RF pulse sequence techniques employing phase cycling, $n\pi$ pulse sequences, and retrograde composite pulse sequences.

It is still a further object of the present invention to provide an RF field strength selective excitation method that is compatible in most case with conventional dipolar decoupling RF pulse sequences.

SUMMARY OF THE INVENTION

The foregoing problems are solved and the foregoing objects are achieved in one illustrative embodiment of the invention in which the nuclear spins are subjected to an RF pulse sequence which introduces a pair of repetitive, alternating rotations about orthogonal axes. The applied pulse sequence consists of a repeating cycle, consisting of a first and a second pulse set. The first pulse set generates a first rotation with an axis aligned with the original orientation of the spin magnetization. In addition, the first pulse set is selected so that the first rotation has a large amplitude and rotates the spins through an angle which varies with the RF field strength. The second pulse set generates a second rotation which has an axis orthogonal to the first rotation axis and a small amplitude which is, ideally, uniform throughout the sample. The angular rotation produced by the second pulse set is ideally independent of the RF field strength.

When the nuclear spins are placed in a non-homogeneous RF field and the above pulse sequence is applied, the angle through which the spins are rotated during the first pulse set will depend on the RF field strength. For those spins that are located in an area where the RF field strength causes the first pulse set to rotate the spins through an angle that is a multiple of $2\pi$, the second, uniform rotation accumulates with each repetition of the first and second pulse sets in order to coherently nutate the spin magnetization of those spins. When the RF field strength is such that the first pulse set rotates the spins through an angle that is not a multiple of $2\pi$, the second rotation is phase modulated in such a manner that the spin magnetization remains in the neighborhood of the first rotation axis and the nuclei are not excited. Selectivity is therefore determined by the extent of the RF field strength dependent first rotation.

BRIEF DESCRIPTION OF THE DRAWING

FIG. 1 is a schematic representation of the desired alternating rotations produced by the DANTE sequence over a period of time.

DETAILED DESCRIPTION OF THE PREFERRED EMBODIMENT

The inventive RF pulse sequence applied implements a selective excitation which is functionally similar to a known selective excitation method known as the DANTE method. The prior art DANTE method is described in detail in articles by G. Bodenhausen, R. Freeman and G. A. Morris, *Journal of Magnetic Resonance*, v. 23, p. 171 (1976) and "Selective Excitation in Fourier Transform Nuclear Magnetic Resonance", G. A. Morris and R. Freeman, *Journal of Magnetic Resonance*, v. 29, p. 433 (1978), which articles are hereby incorporated by reference.

As described in the aforementioned articles, for liquid sample experiments, in which the main static field is applied along the Z axis by convention, the known DANTE RF pulse sequence consists of a series of m short (length $t_p$) RF pulses along the Y axis separated by free spin evolution periods (length $t_1$) during which no pulses are applied with the condition that $m\omega_1 t_p = \pi/2$ where $\omega_1$ is the Larmor angular velocity corresponding to the RF field strength of the applied pulses. In the conventional application of the DANTE pulse sequence, it is assumed that the RF field strength is uniform across the liquid sample.

It is convenient to regard this DANTE pulse sequence as inducing an alternating series of rotations to the spin magnetization of the subject nuclei. The applied pulse sequence is chosen so that the spin magnetization is aligned with the first rotation axis. In addition, the amplitude of the NMR signal produced by this latter rotation is arranged to be large and to vary with the Hamiltonian upon which selectivity is to be based. The applied pulse sequence is also chosen so that the amplitude of the NMR signal generated by the second rotation is normally small and uniform throughout the sample and is independent of the Hamiltonian upon which the selectivity is to be based.

For example, in the case of a DANTE sequence which is selective with regard to chemical shifts, these rotations are indicated by the notation $[(\omega_o + \omega_{cs})t_1 I_z, \omega_1 t_p I_y]^m$, where $\omega_o$ is an offset frequency, $\omega_{cs}$ is the chemical shift frequency and $\omega_1$ is the frequency corresponding to the radio-frequency field strength and m is the number of times the entire pulse sequence is repeated. This notation indicates that each pulse of the DANTE pulse sequence effectively causes a rotation about the Z axis through the angle $(\omega_o + \omega_{cs})t_1$ followed by a rotation about the Y-axis through an angle $\omega_1 t_p$. The entire pulse sequence then repeats the two individual rotation sequence m times.

The selectivity of the DANTE method is revealed by treating the Hamiltonian dependent rotation (which is often, for example, an $I_z$ rotation produced by chemical shifts) as a phase shift of the uniform rotation (which is conventionally produced by a short RF pulse applied to produce an $I_y$ rotation). This approach, corresponds to looking at the nuclear spin system in a reference frame tied to a test spin. In this reference frame, the DANTE pulse sequence reduces to a series of RF pulses with incremented phases. When the phase increment between pulses is a multiple of $2\pi$ then the rotations induced by the RF pulses accumulate, however for other phase increments the rotations do not accumulate and the spin magnetization remains in the neighborhood of the $I_z$ axis.

In a linear approximation, the frequency response of this phase shifted pulse train is a set of evenly spaced sinc pulses. The spacing of the sinc pulses is given by the reciprocal of the strength of the Hamiltonian-dependent rotation and its duration, and the width of each sinc function is proportional to the reciprocal of the number of times the process is repeated (the number of RF pulses in the above example).

In accordance with the invention, in order to use a DANTE-like sequence to selectively excite spins based on the RF field strength in which the spins are located, the Hamiltonian-dependent rotation must vary with the RF field strength. This dependency is easily accomplished with an RF pulse.

However, the RF pulse which is normally used to generate the uniform rotation cannot be used in this application because such an RF pulse would make the uniform rotation dependent on the RF field strength and, as discussed above, it is necessary for the uniform rotation to be independent of the RF field strength for the DANTE method to operate properly. In accordance with the invention, the uniform rotation is created by using a phase change during an RF pulse train to generate the uniform rotation.

More particularly, a phase change of the RF appears uniformly throughout the RF field regardless of the strength of the RF field. Since a phase change, by itself, does not induce any spin evolution, the phase change is incorporated into a pulse cycle. Theoretically, it is not possible to design a pulse sequence which generates a rotation based on the phase behavior of the RF throughout the pulse sequence, but is absolutely independent of the overall RF field strength. In practice, it is impossible to create such a cycle since, for example, at zero RF field strength, the induced rotation is zero regardless of the phase behavior of the RF pulse train.

However, in accordance with another aspect of the invention, it is recognized that the uniform rotation need only accumulate for a periodic set of RF field strengths. Consequently, the inventive pulse cycle can be selected to periodically generate a nearly uniform rotation in a series of "active regions" and between these "active regions" the "uniform" rotation can be nearly zero. In this manner, spins which are aligned along a given axis only experience rotations about that same axis and, therefore, remain effectively spin locked.

Figures 1A, 1B:
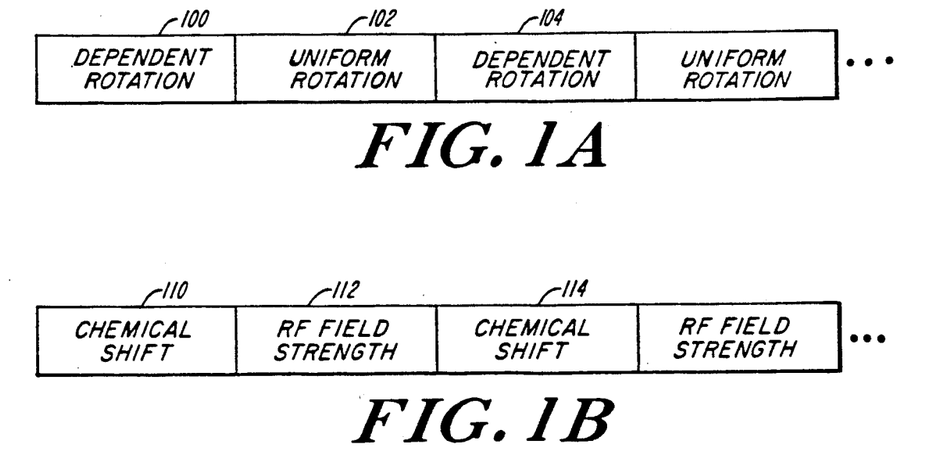
FIGS. 1B and 1C illustrate a conventional DANTE method applied to a spin system for chemical shift selectivity.

FIGS. 1A–1E compare the conventional DANTE pulse sequence to the inventive DANTE like method for liquid samples. In particular, FIG. 1A is a chart representing the desired alternating rotations produced by the DANTE sequence over a period of time. In the illustrative sequence, a Hamiltonian-dependent rotation 100 is followed by a uniform Hamiltonian-independent rotation 102 which is, in turn, followed by another Hamiltonian-dependent rotation 104, etc.

Figure 1C:
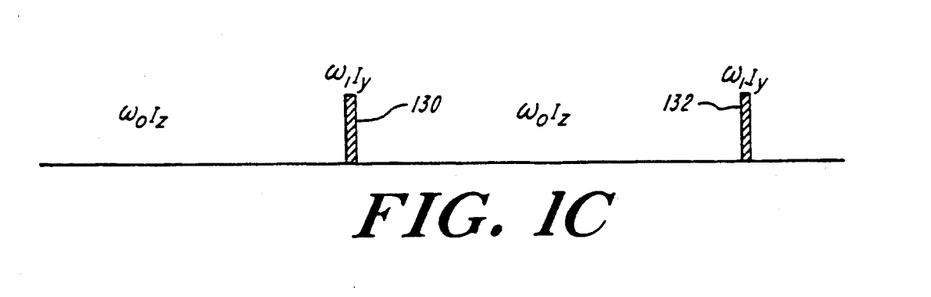

FIGS. 1B and 1C illustrate the conventional DANTE method applied to a spin system for chemical shift selectivity. FIG. 1B represents the desired alternating pattern of rotations. The original DANTE method, as implemented in the prior art as described above, was used for chemical shift selectivity. Consequently, the Hamiltonian-dependent rotation is the chemical shift Hamiltonian (about the Z-axis) and the uniform rotation is produced by a short RF pulse (about the Y-axis).

In particular, the Hamiltonian-dependent rotation is based on the chemical shift as illustrated in block 110. This rotation is followed by a "uniform" rotation tied to the RF field strength in block 112. As previously mentioned, in the conventional DANTE sequence, the RF field strength is assumed to be constant over the sample. The uniform rotation is followed by another chemical shift-dependent rotation as illustrated in block 114, etc.

FIG. 1C illustrates the pulse sequence used in the conventional DANTE method. The chemical shift dependent rotation is produced by spin evolution under influence of the chemical shift as indicated by the term $(\omega_o+\omega_{cs})I_z$. The chemical shift rotation is followed by the uniform rotation which is generated by an RF pulse which induces a rotation $\omega_1 I_y$ for the duration of the pulse, the pulse is schematically illustrated by the black vertical bar 130. The uniform rotation is followed by another period of spin evolution, which is, in turn, followed by another pulse-induced rotation 132.

Figure 1D:
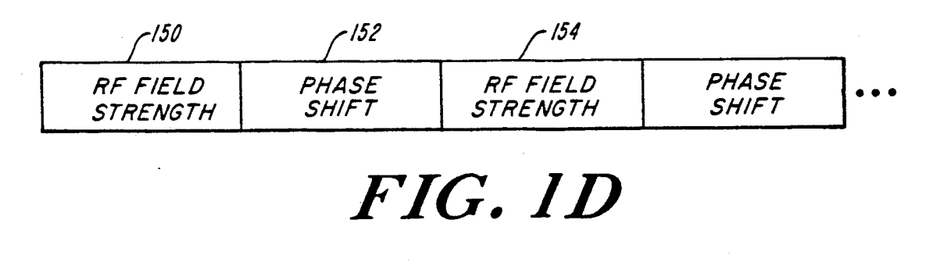
FIGS. 1D and 1E show the application of the inventive method to a liquid sample for RF field strength selection.
Figure 1E:
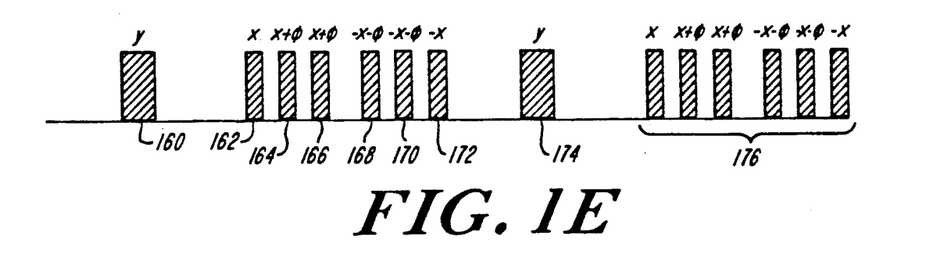

FIGS. 1D and 1E show the application of the inventive method for DANTE like RF field strength selection to a liquid sample. For selecting a given RF field strength, the Hamiltonian dependent rotation is produced by an RF pulse which nutates the spins of interest by a non-zero multiple of $2\pi$. The small uniform rotation is created by a pulse cycle which creates a Y-axis rotation proportional to a phase shift for RF pulses which are odd multiples of $\pi/2$. Where the RF field strength is such that the pulse length is g not an odd multiple of $\pi/2$, the effective rotation is nearly zero.

FIG. 1D illustrates the desired alternating rotations. In the inventive method, the Hamiltonian-dependent rotation is now dependent on the RF field strength as indicated in block 150 whereas the "uniform" rotation is now generated by a phase shift, 152, as previously-described. The RF field strength dependent rotation is simply a nutation pulse described by the equation:

$$H_n = \gamma \omega_1(r) t_p I_x \quad (1)$$

where $\gamma$ is the gyromagnetic ratio, $\omega_1$ is a spatially-dependent RF field strength, r is a spatial coordinate representing the radial distance from the field center to a particular coordinate position and $t_p$ is the RF pulse length. The form of the nutation pulse is schematically shown in FIG. 1E as pulse 160 and has a predetermined length as discussed below. The letter designation Y above pulse 160 indicates the RF phase of the pulse. By convention, the applied fields are referenced to a Cartesian coordinate system with the main, static field pointing along the Z-axis. The applied RF fields are polarized 90° to the main field or along the X and Y axes. Since the X and Y axes are arbitrary directional designations, the pulse designations of X and Y are taken to represent relative phases of the signals. For example a RF pulse designated as an X pulse has a relative phase shift of 90° with respect to an RF pulse designated as a Y pulse. Similarly, an RF pulse designated as X or $-X$ has a relative phase shift of 180° with respect to an X pulse.

The "uniform" rotation, 152, is generated by a pulse cycle which creates a periodic rotation proportional to a phase shift within the cycle in accordance with the equation:

$$H_p = 4n\Phi I_y \quad (2)$$

for $(2n+1)\pi/2$ pulse lengths where $\Phi$ is the phase shift accumulated during each phase rotation pulse cycle and n is an integer indicating the number of pulse cycles. An illustrative pulse sequence which produces such a rotation is shown in FIG. 1E as pulses 162–172. The initial pulse 162 is applied as an X pulse or with a phase shift of 90° relative to the previous pulse. The succeeding pulses 164 and 166 are advanced in phase from pulse 162 by phase increments of $\Phi$, respectively. The next two pulses, 168 and 170, are applied 180° out of phase with the previous pulse 166 and the last pulse is applied so that it is 180° out of phase with the first pulse 162.

The DANTE cycle is then repeated, with a new nutation pulse, 174, being applied and a subsequent phase-shifted pulse set 176. Operation continues in this manner.

Figure 2A:
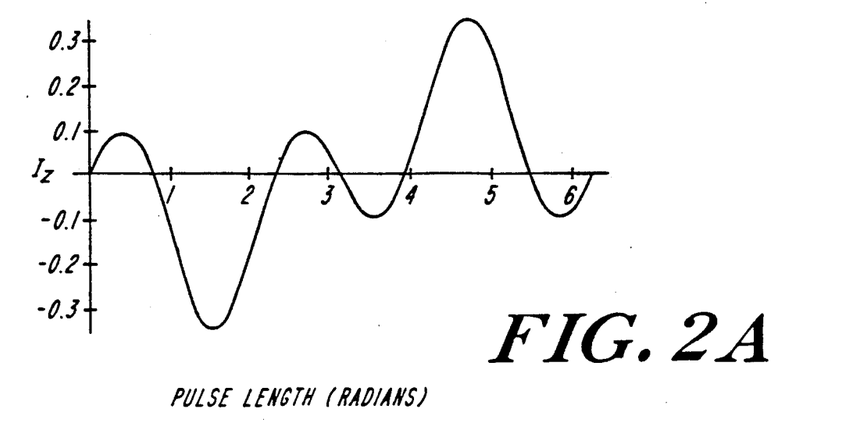
FIGS. 2A–2C are graphs representing the results of explicit calculations of the effective spin rotation caused by the application of one cycle of the phase shift rotation pulse cycle for a magnetization vector originally oriented along the X axis.
Figure 2B:
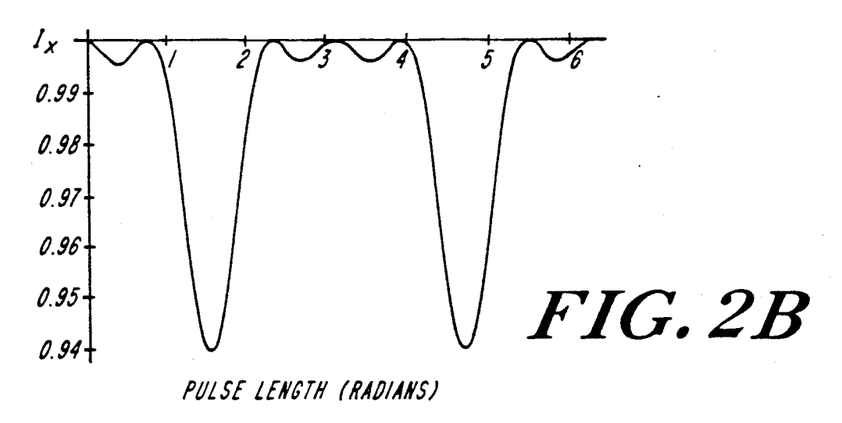
Figure 2C:
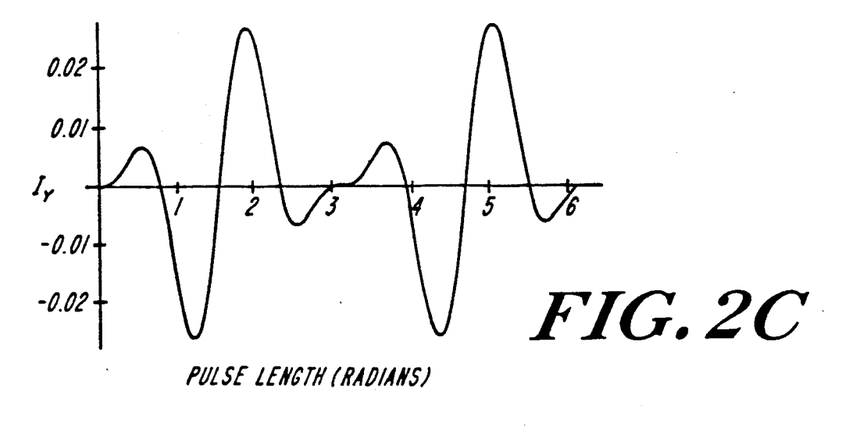

FIGS. 2A–2C show explicit calculations of the spin rotation generated by one cycle of the phase rotation pulse cycle (for example, pulses 162–172 in FIG. 1E) for spin magnetization vector starting with an orientation along the X-axis. In FIGS. 2A–2C, the pulse length for each of the pulses which make up the pulse sequence is shown along the abscissa and is assumed to be the same for each pulse. More particularly, FIG. 2A shows the calculated spin component along the Z-axis versus pulse length; FIG. 2B shows the calculated spin component along the X-axis versus pulse length and FIG. 2C illustrates the calculated spin component along the Y-axis versus length.

As shown in FIGS. 2A–2C, for pulse lengths equal to odd multiples of a $\pi/2$ pulse length (approximately 1.57 radians), the generated motion is mainly in the X-Z plane or simply a rotation about the Y-axis, and for other pulse lengths the rotation is approximately zero. The sense of the rotation about the Y-axis alternates so that pulses with a length which is an even multiple of a $\pi/2$ pulse length cause a rotation in accordance with the phase shift and pulses with a length which is an odd multiple of a $\pi/2$ pulse length cause a rotation in the opposite direction. This shift in rotation sense has little consequence on the overall selectivity of the method.

An important feature of this phase rotation pulse cycle is that the axis of the generated rotation is always very nearly along the Y-axis and, for pulse lengths that are an odd multiple of a $\pi/2$ pulse, the rotation axis is exactly along the Y-axis. This rotation behavior is sufficient to ensure that the selected spins will evolve from the X-axis to the Z-axis in such a fashion that after each X rotation, the spins of interest will be in the X,Z plane.

When the pulse length for the pulses in the phase rotation cycle is an odd multiple of a $\pi/2$ pulse length, the phase rotation cycle is similar to that produced by the well-known Carr-Purcell RF pulse cycle and is effective at suppressing off-resonance and chemical shift effects. This is easily seen by transforming the pulse cycle to the RF toggling frame and including two additional windows, one before, and one after, the cycle. This line-narrowing makes the cycle simpler to apply, but for liquids another robust solution is simply to run the cycle as fast as possible (i.e. make the RF field strength much stronger than the chemical shifts). For RF field selection, all of the rotation intervals depend exclusively on RF field strengths and the intervals between pulses can be made arbitrarily short.

Consequently, in accordance with the inventive method, when the pulse sequence shown in FIG. 1E is used, two conditions must be met: first, the RF nutation pulse, 160, must rotate the spins of interest by a multiple of $2\pi$; and, second, the pulse widths of the phase rotation cycle pulses, 162-172, must be set in the neighborhood of an odd multiple of a $\pi/2$ pulse length. Since the rotation produced by the nutation pulse depends both on the RF field strength and the pulse length, selectivity can be achieved by adjusting the nutation pulse length so that the desired RF field strength causes a rotation through an angle which is a multiple of $2\pi$. The spacing of the selected RF field strengths is $(t_p)^{-1}$, and the width of the resulting sinc shape at the first zero crossing is $(nt_p)^{-1}$. With this inventive pulse sequence, an important distinction between the inventive sequence and a conventional DANTE sequence is that, at zero rotation from the Hamiltonian-dependent interaction (for example, at zero RF field strength) there is, of course, no nutation. Accordingly, selectivity is only obtained at the non-zero order sidebands.

Figure 3A:
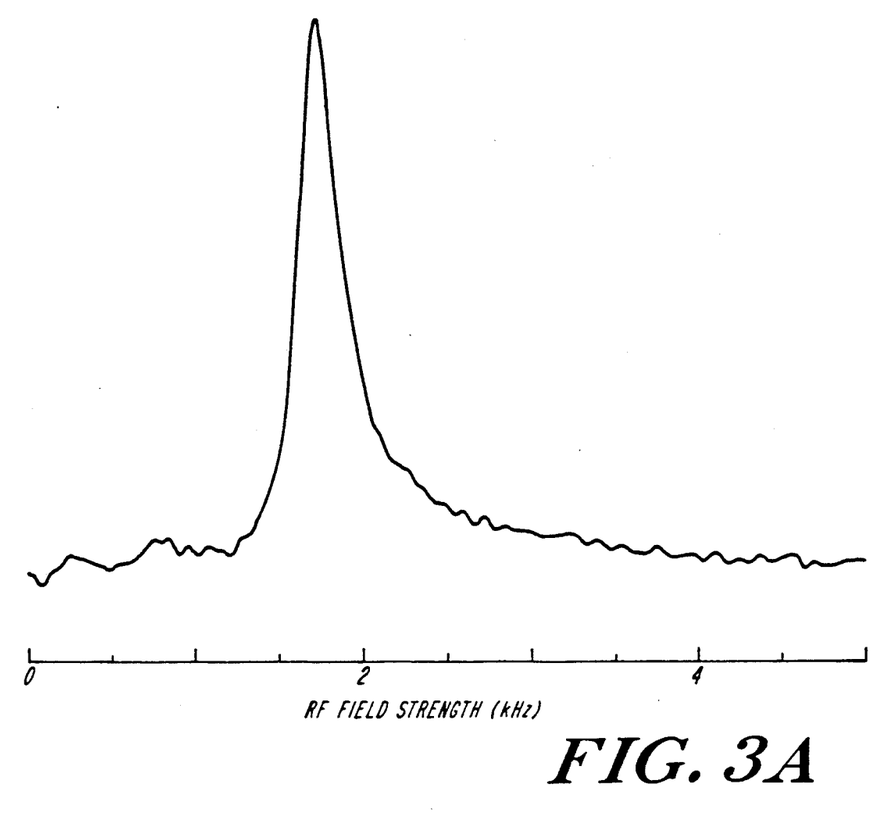
FIG. 3A is an RF profile or graph of NMR output signal amplitude versus RF signal strength for a small sample of water located in the homogeneous region of an RF solenoid coil without the application of the inventive RF field strength selection pulse sequence.
Figure 3B:
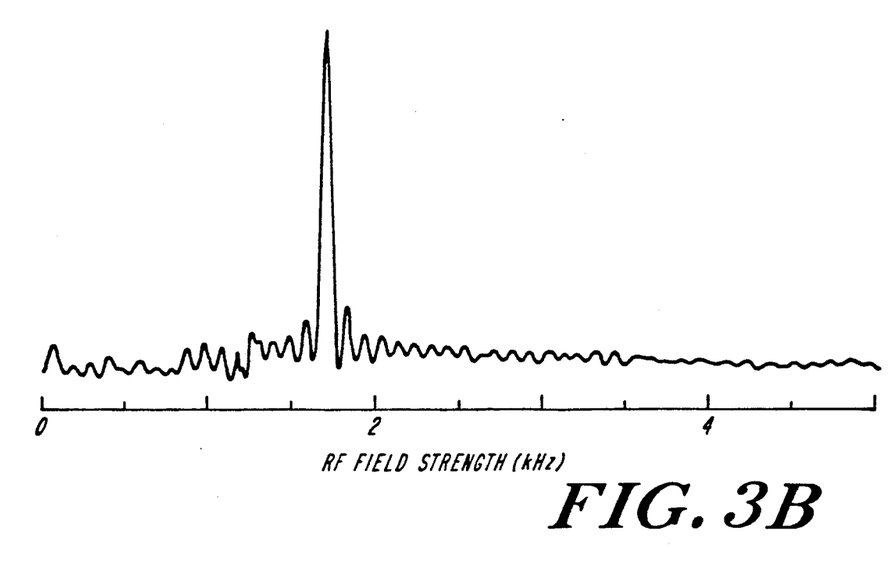
FIG. 3B is an RF profile or graph of NMR output signal amplitude versus RF signal strength for the same experimental setup as used to generate the NMR signal illustrated in FIG. 3A which illustrates an improvement obtained by applying the inventive RF field strength selective excitation pulse sequence illustrated in FIG. 1E.

FIGS. 3A and 3B show the results of applying the inventive sequence to selectively excite spins which are located in the homogeneous region of an RF solenoid coil. For comparison, FIG. 3A illustrates the RF field strength for a small sample of water located within the RF coil without any RF field strength selection. The range of RF field strengths present within the coil, called the "RF profile", was mapped out in a conventional manner by using a nutation sequence in which a string of short RF pulses was applied with a single data point acquired stroboscopically between the pulses. The RF pulses create an RF field-dependent nutation which is sampled and, after Fourier transformation, yields the RF field profile. As seen in FIG. 3A, the RF field for the illustrative solenoid coil is not very homogeneous.

FIG. 3B illustrates an RF profile for the same sample of water located within the same RF coil when the inventive selection method outlined in FIG. 1E is used to selectively excite only those spins located in a homogeneous region of the RF field. Each phase rotation cycle generates a 4Φ rotation, and so the phase shift s set such that n $4\Phi = \pi/2$. In accordance with the inventive method, the selected spins are located along the Z-axis. The length of the nutation pulse is adjusted to yield the desired selectivity, but is always set sufficiently long that the phase cycle rotation looks uniform for the spins of interest.

FIGS. 3A and 3B were obtained using a model MSL 400 NMR spectrometer manufactured by Bruker Instruments, Manning Park, 19 Fortune Drive, Billerica, Mass. 01821, operating at a resonance frequency of 400 MHz for protons. For FIG. 3B, the nutation pulse length was 105 μs, the pulse length of each of the pulses during the phase shift rotation cycle was 15 μs. The overall phase shift achieved by the phase shift rotation subcycle was 1.25° and 18 nutation and phase rotation cycles were used to select this profile. As with FIG. 3A, the data obtained were also Fourier transformed to produce FIG. 3B. As shown in FIG. 3B, the selectivity is quite good and the selected region of the RF field is clearly much sharper than the original RF field profile shown in FIG. 3A.

It should be clear that it is possible to set up the experiment such that no spins in the sample simultaneously experience the right combination of fields to be excited resulting in no output. This null result can be easily avoided by adjusting the nutation pulse length to be a multiple of four times the pulse lengths used in the phase rotation cycle. This condition is not necessary to generate a selected spin packet, but there is no reason to use longer than a $\pi/2$ pulse length in the phase rotation cycle pulses and it is advantageous to employ a long nutation pulse (assuming that the goal is to obtain the greatest possible selectivity).

The inventive method is also applicable to solid samples, but must be modified to take into account additional problems encountered in solids that are not present in liquids. More particularly, for most spectroscopic and imaging experiments, it is desirable that the natural resonance line be narrowed as much as possible to increase system resolution. For example, for spin=½ nuclei and for systems in which guadrupole effects can be neglected, the natural resonance line width in a sample is greatly influenced by dipolar couplings. Dipolar couplings result from interactions between the magnetic moments in neighboring nuclei and tend to broaden the characteristic resonance lines. In liquids, the field perturbations induced by dipolar couplings are time averaged to zero by the continuous motion of individual molecules and thus do not severely affect image resolution, but in solids, these couplings can give rise to very large static magnetic field components that can significantly widen a resonance peak.

Consequently, it is necessary to modify the inventive method as described above with respect to liquids in order to reduce the effects of dipolar coupling. For example, in another illustrative pulse sequence, in accordance with another aspect of the invention, the nutation pulse used in the liquid sample method to induce the RF dependent rotation can be replaced by a composite dipolar decoupled inversion pulse.

Composite dipolar decoupled inversion pulses and their characteristics are known in the art and are described in more detail, for example, in "Time Suspension Multiple Pulse Sequences Application to Solid State Imaging", D. G. Cory, J. B. Miller and A. N. Garroway, *Journal of Magnetic Resonance*, v. 90, p. 205 (1990), which article is hereby incorporated by reference.

Figure 4:
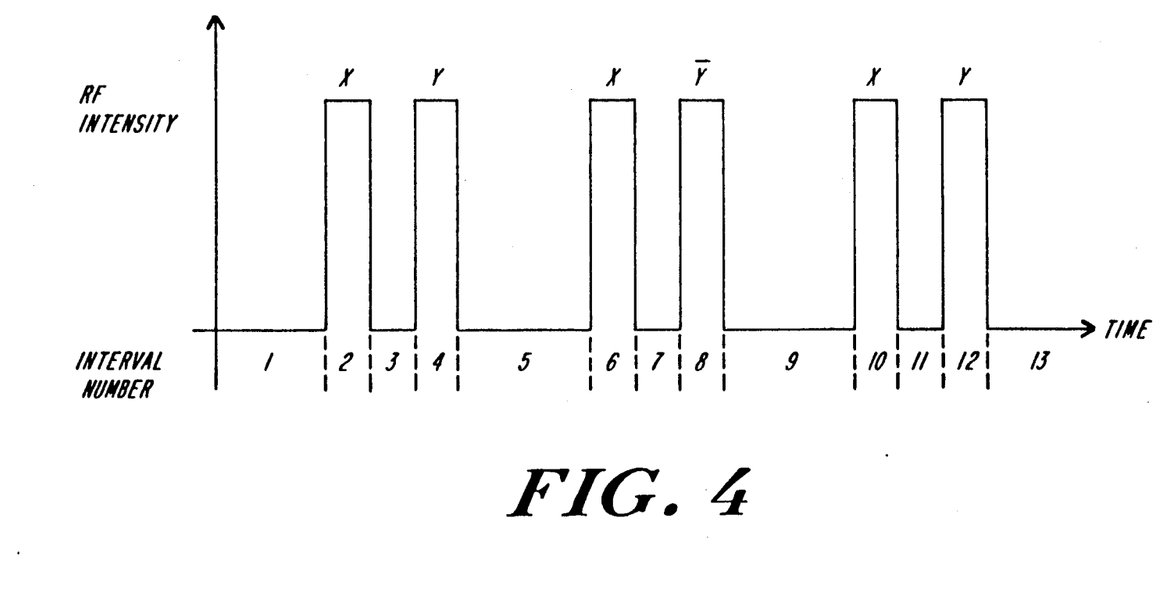
FIG. 4 is a schematic diagram of a dipolar decoupled inversion pulse useful in an inventive pulse sequence applicable to solid samples.

An illustrative six pulse composite pulse sequence is shown in FIG. 4 and is made of thirteen time intervals numbered illustratively as intervals 1-13. There are three pulse pairs with each pulse having a time duration of α which comprise time intervals 2, 4, 6, 8, 10 and 12. A time delay between pulses comprises time intervals 3, 7, and 11. In a standard solid echo pulse pair, this delay is set at one-half of the time intervals between pulse pairs (time intervals 1, 5, 9 and 13). The "X" and "Y" notations above the pulse designations have the meaning as previously discussed with respect to FIG. 1. This sequence of pulses generates a nutation that is independent of dipolar couplings.

To further reduce the effects of dipolar coupling, a dipolar decoupling sequence can also be added to the phase rotation subcycle. A number of well-known pulse sequences can be used for this purpose. Illustratively, a modification of the well-known MREV-8 pulse sequence called the "Dybowski-Vaughon" modification can be used. Although this pulse sequence is normally used for relaxation studies, it is suitable for use with the inventive sequence.

Figure 5A:
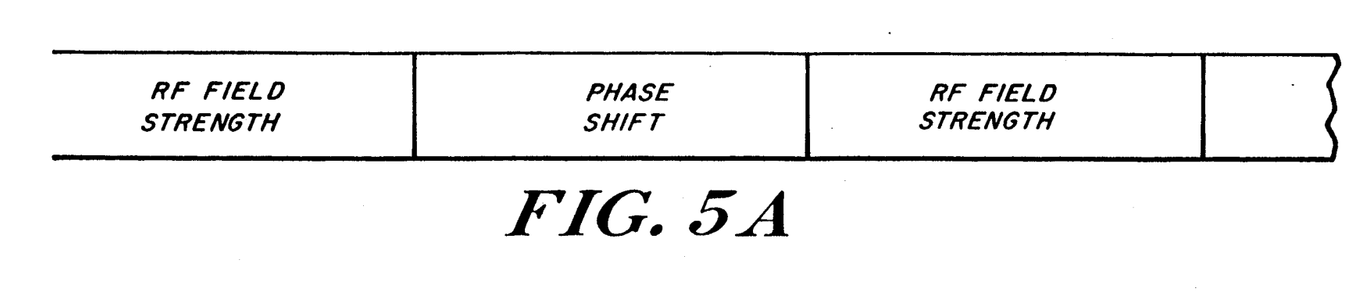
FIGS. 5A–5C schematically illustrate a complete illustrative DANTE-like pulse sequence applicable to solid samples.
Figure 5B:
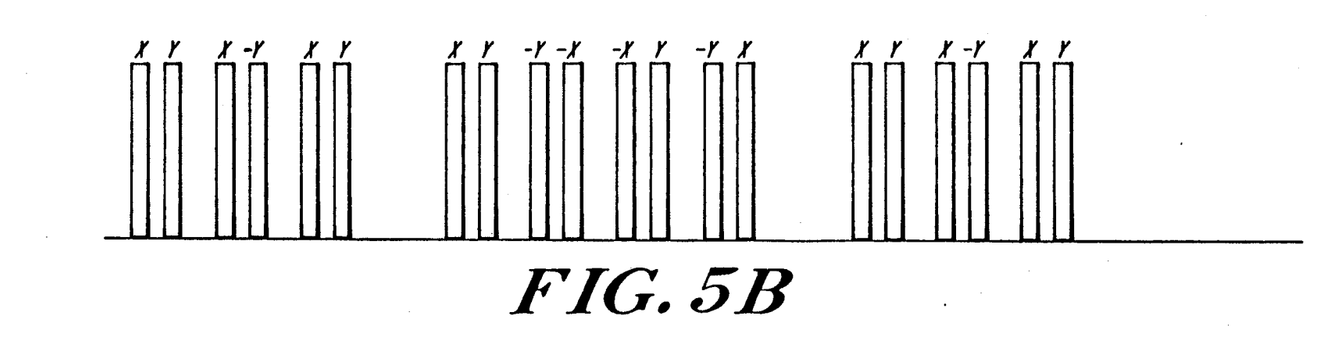

The complete illustrative DANTE-like pulse sequence suitable for use with solids is shown in FIGS. 5A and 5B. FIG. 5A illustrates the desired alternating rotations. In the inventive method, the Hamiltonian-dependent rotation is now dependent on the RF field strength as indicated in block 550 whereas the "uniform" rotation is now generated by a phase shift, 552, as previously described.

Figure 5C:
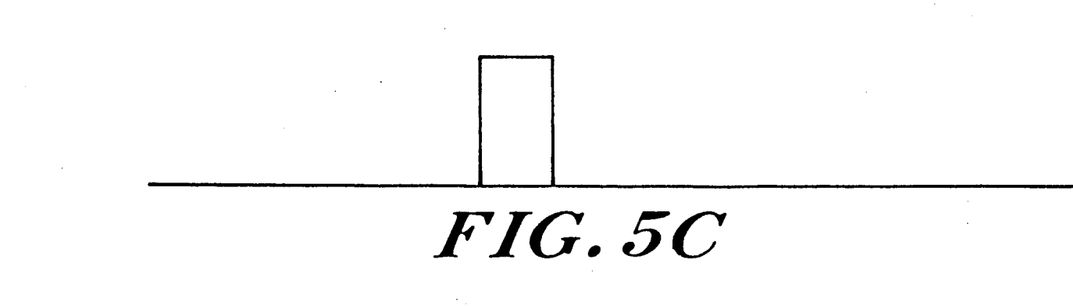

As shown in FIG 5B, the RF field strength-dependent rotation is the dipolar decoupled inversion pulse described above, which consists of six pulses 554-558 with the spacing mentioned previously. The field independent rotation is generated by the illustrative eight-pulse sequence 560. The Dybowski-Vaughon modification introduces a phase toggle which is illustrated in FIG. 5C. As mentioned, this sequence produces the desired phase rotation and also introduces dipolar decoupling.

Although only two embodiments of the inventive method have been described, several obvious modifications and changes will be immediately apparent to those skilled in the art. For example, when the inventive method is applied to liquid samples, it is desirable, in most cases, to use a phase rotation subcycle that suppresses chemical shifts. The preferred phase rotation subcycle illustrated in FIG. 1E accomplishes chemical shift suppression. However, in cases where off-resonance effects can be safely neglected, simpler phase rotation subcycles can be employed.

In addition, when only a single selective excitation band of the RF field strength is desired, the inventive method can be repeated at two incommensurate spacings to cancel the undesired bands.

Further, since the nutation pulse is always a $2n\pi$ pulse, any of several well known retrograde composite pulses can be substituted for the nutation pulse.

These modifications and other obvious changes are intended to be covered by the following claims.

What is claimed is:

1. In an NMR spectrometer in which NMR-active nuclei having nuclear spins are placed in a main static magnetic field to produce a net spin magnetization with a direction and a radio-frequency field having a spatially-varying strength is applied to said nuclei, a method for exciting only selected ones of said nuclear spins located in a spatial volume in which said radio-frequency field has a predetermined strength, said method comprising the steps of:
   A. applying to said nuclei at least one first radio-frequency pulse selected to generate a first nuclear spin rotation with a first amplitude and a first rotation axis aligned with said spin magnetization direction and further selected to rotate said nuclear spins through an angle which varies with said radio-frequency field strength;
   B. applying to said nuclei at least one second radio-frequency pulse selected to generate a second nuclear spin rotation with a second amplitude which is less than said first amplitude and with a second rotation axis orthogonal to said first rotation axis and further selected to rotate said nuclear spins through an angle which is independent of said radio-frequency field strength; and
   C. repeating steps A and B a predetermined number of times.

2. In an NMR spectrometer, the selective excitation method according to claim 1 wherein
   said at least one first radio-frequency comprises a nutation pulse having a phase and a pulse length selected to rotate said selected ones of said nuclear spins through an angle which is a non-zero multiple of $2\pi$.

3. In an NMR spectrometer, the selective excitation method according to claim 2 wherein step B comprises the step of:
   B1. applying to said nuclei radio-frequency pulses in addition to said at least one second radio-frequency pulse, said pulses together comprising a train of radio-frequency pulses, the effective field of said train of pulses having a phase shift of 90° from said nutation pulse phase.

4. In an NMR spectrometer, the selective excitation method according to claim 2 wherein step B comprises the step of:
   B2. applying to said nuclei said at least one second radio-frequency pulse and a plurality of additional radio-frequency pulses which pulses together form a train of six radio-frequency pulses having the phases X, X+Φ, X+Φ, −X−Φ, −X−Φ, −X where X indicates a phase shift of 90° with respect to the phase of said nutation pulse and −X indicates a phase shift of 270° with respect to said phase of said nutation pulse and Φ indicates a phase difference between pulses in said pulse train.

5. In an NMR spectrometer, the selective excitation method according to claim 1 wherein step B comprises the step of:
   B3. applying to said nuclei said at least one second radio-frequency pulse and a plurality of additional pulses which pulses together form a composite pulse wherein said composite pulses together form a composite pulse wherein said composite pulse is selected to rotate said nuclear spins through an angle which is uniform throughout the sample and about an axis that is orthogonal to said at least one first radio-frequency pulse.

6. In an NMR spectrometer, the selective excitation method according to claim 1 wherein step A comprises the step of:
   A2. applying to said nuclei said at least one first radio-frequency pulse and a plurality of additional pulses which pulses together form a composite dipolar decoupled inversion pulse having a composite pulse length selected to rotate said selected ones of said nuclear spins through an angle which is a non-zero multiple of $2\pi$.

7. In an NMR spectrometer, the selective excitation method according to claim 6 wherein
   said composite dipolar decoupled inversion pulse comprises six pulses having the phases X, Y, X, −Y, X, Y where phase X indicates a phase shift of 90° with respect to phase Y and −X indicates a phase shift of 180° with respect to phase X.

8. In an NMR spectrometer, the selective excitation method according to claim 6 wherein step B comprises the step of:
   B5. applying to said nuclei said at least one second radio-frequency pulse and a plurality of additional radio-frequency pulses which pulses together form a train of eight radio-frequency pulses having the phases X, Y, −Y, −X, −X, Y, −Y, X where X indicates a phase shift of 90° with respect to the phase of said nutation pulse and −X indicates a phase shift of 180° with respect to said phase of said at least one first radio-frequency pulse.

9. A method for operating an NMR spectrometer in which NMR-active nuclei are placed in a main static magnetic field to produce a net spin magnetization with a direction and a radio-frequency field having a spatially-varying strength is applied to said nuclei to excite nuclear spins, said method comprising the steps of:

A. applying to said nuclei at least one first nutation pulse having a first phase and a first pulse length selected to generate a first nuclear spin rotation with a first amplitude and a first rotation axis aligned with said spin magnetization direction;

B. adjusting said first pulse length so that said at least one first nutation pulse rotates selected ones of said nuclear spins located in a spatial volume in which said radio-frequency field has a predetermined strength through an angle which is a non-zero multiple of $2\pi$;

C. applying to said nuclei a train of pulses, each pulse in said train of pulses having a phase shift from a phase of a preceding pulse in said pulse train, said train of pulses being selected to generate a second rotation with a second amplitude which is less than said first amplitude and with a second rotation axis orthogonal to said first rotation axis and further selected to rotate said nuclear spins through an angle which is proportional to said phase shift; and D. repeating steps A, B and C a predetermined number of times in order to excite only said selected ones of said nuclear spins.

10. A method for operating an NMR spectrometer according to claim 9 wherein step A comprises the step of:

A1. applying to said nuclei a single radio-frequency nutation pulse.

11. A method of operating an NMR spectrometer according to claim 19 wherein
each pulse of said train of pulses has a pulse duration which is an odd multiple of a 90 /2 pulse duration.

12. A method for operating an NMR spectrometer according to claim 9 wherein
said train of pulses comprises a train of six radio-frequency pulses having the phases X, X+Φ, X+Φ, −X−Φ, −X−Φ, −X where X indicates a phase shift of 90° with respect to the phase of said nutation pulse and −X indicates a phase shift of 270° with respect to said phase of said nutation pulse and Φ indicates a phase difference between pulses in said pulse train.

13. A method of operating an NMR spectrometer according to claim 9 wherein step A comprises the step of:

A2. applying to said nuclei said at least one first nutation pulse and a plurality of additional pulses, which pulses together form at least one composite dipolar decoupled inversion pulse comprised of a plurality of radio-frequency pulses.

14. A method of operating an NMR spectrometer according to claim 9 wherein said train of pulses comprises a train of eight radio-frequency pulses having the phases X, Y, −Y, −X, −X, Y, −Y, X where X indicates a phase shift of 90° with respect to the phase of said nutation pulse and −X indicates a phase shift of 180° with respect to said phase of said nutation pulse.

* * * * *